(12) United States Patent
Musil

(10) Patent No.: US 6,578,091 B1
(45) Date of Patent: Jun. 10, 2003

(54) CIRCUIT ARRANGEMENT AND METHOD FOR CHECKING DATA

(75) Inventor: Gerhard Musil, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/392,848

(22) Filed: Sep. 9, 1999

(30) Foreign Application Priority Data

Sep. 9, 1998 (DE) .......................... 198 41 201

(51) Int. Cl.$^7$ .................. G06F 13/10; G06F 13/14; G06F 12/14
(52) U.S. Cl. ................ 710/8; 710/15; 710/16; 710/104; 714/6; 714/7
(58) Field of Search ................ 710/8, 15, 16, 710/104; 714/6, 7

(56) References Cited

U.S. PATENT DOCUMENTS 5,265,241 A * 11/1993 Arnold et al. .............. 709/223
5,579,270 A * 11/1996 Yamazaki ............... 365/185.14
5,758,070 A * 5/1998 Lawrence ................... 709/220
6,212,643 B1 * 4/2001 Ademmer et al. ............ 710/10
6,324,626 B1 * 11/2001 Uenoyama et al. ........... 463/29

* cited by examiner

Primary Examiner—Jeffrey Gaffin
Assistant Examiner—Rehana Perveen
(74) Attorney, Agent, or Firm—Bell Boyd & Lloyd LLC

(57) ABSTRACT

A circuit arrangement and a method for storing configuration data both use a first storage of a processor to store the configuration data. This configuration data for a device unit startup is not released before an identifier that characterizes the configuration data conforms with an identifier held in a second storage unit that is inseparably connected in an electrical manner to the rear panel of the device unit. The second storage unit is preferably fashioned from passive elements.

8 Claims, 2 Drawing Sheets

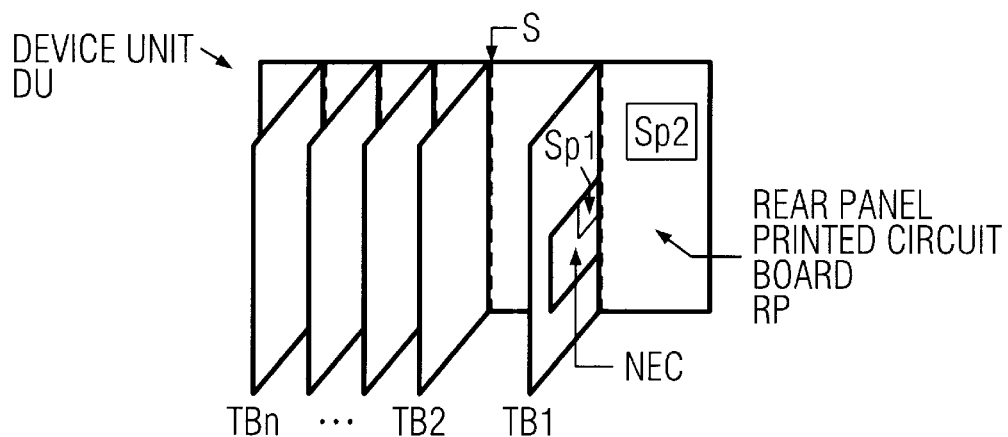
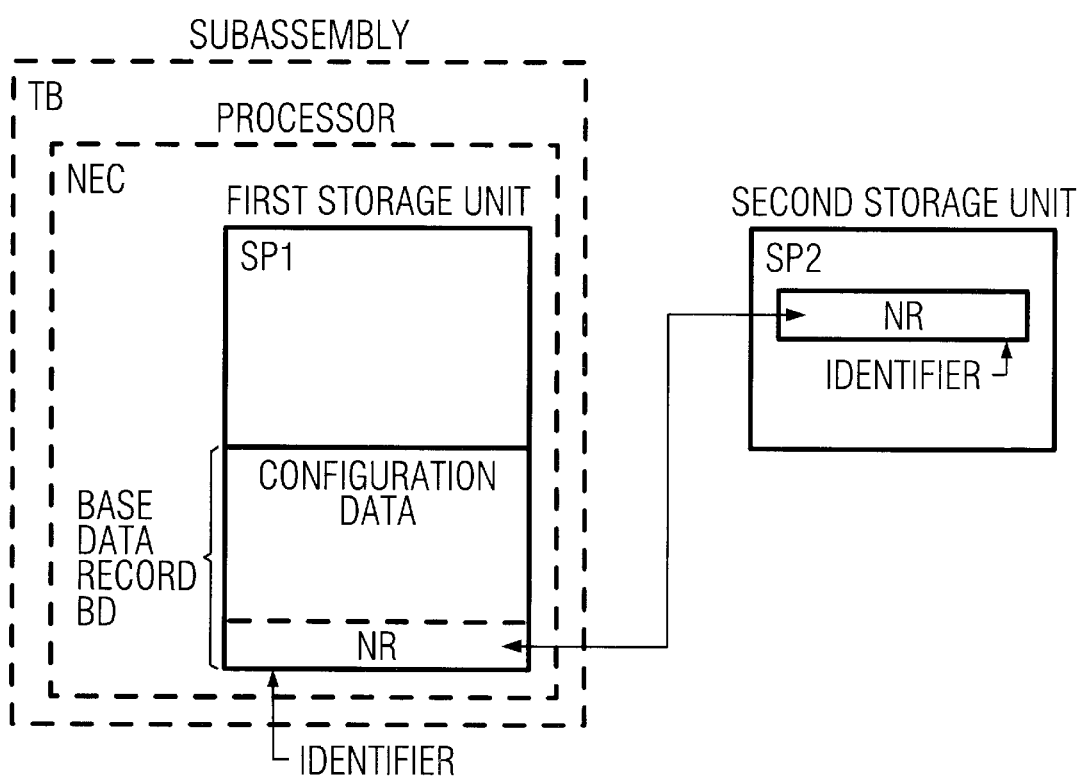

CIRCUIT ARRANGEMENT AND METHOD FOR CHECKING DATA

BACKGROUND OF THE INVENTION

1. Field of the Invention

The invention relates to a circuit arrangement and method used to store configuration data for a device unit which holds devices, where the identity of a particular device unit is verified and configuration data is released to the device unit after successful verification.

2. Description of the Prior Art

Configuration data that must be permanently stored has historically been stored in storage units on a processor unit or on rear panel printed circuit boards. This storage has been implemented as programmable read-only memories (EEPROM or EPROM). Unfortunately, these programmable read-only memories are mechanically difficult to exchange, and are susceptible to mistakes due to programming errors or exchanging the wrong memory.

SUMMARY OF THE INVENTION

The object of the invention is to provide a circuit arrangement and a method for checking data that avoids the above-mentioned disadvantages. This objective is inventively achieved by utilizing an identifier storage unit that is inseparably connected to a rear panel of a device unit (sub-rack). This identifier storage unit holds a permanent identifier, and this permanent identifier is compared to identifiers stored in plug-in subassemblies (boards or circuitry that plugs into the sub-rack). Configuration data located on the subassemblies, and associated with the plug-in assembly identifiers, can then be released to the device unit given a conformity between the plug-in assembly identifiers and the permanent identifier on the rear panel of the device unit.

The invention has the following advantages: 1) the second storage unit is not susceptible to failures and does not have to be exchanged, 2) data mistakes by programming errors or by assembling the second storage unit is precluded, 3) configuration data can be redundantly stored within homogenous plug-in subassemblies or device units, in which valid data records can be securely differentiated from data that potentially do not belong to the device, and 4) the second storage is inseparably connected to the rear panel printed circuit board. Further advantageous embodiments of the circuit arrangement and the method are described below.

BRIEF DESCRIPTION OF THE DRAWINGS

FIG. 1 is a physical diagram showing a device unit configuration;

FIG. 2 is a block diagram showing an allocation of storage units and data contained therein;

DESCRIPTION OF THE PREFERRED EMBODIMENTS

FIG. 1 shows a configuration of a device unit (or sub-rack) DU, which has a rear panel printed circuit board RP and plug-in subassemblies $TB_{1\ to\ n}$. A processor, a network element controller NEC, is arranged on a primary plug-in subassembly $TB_1$. The plug-in subassemblies $TB_{1\ to\ n}$ are connected to the rear panel printed circuit board RP via connection lines S via plug-in connectors, for example. A first storage unit $SP_1$ is arranged in the network element controller NEC and a second storage unit $SP_2$ is arranged on the rear panel printed circuit board RP.

In this device configuration, where exchangeable plug-in subassemblies $TB_{1\ to\ n}$ are connected to the rear panel printed circuit board RP via plug-in connector strips, the plug-in subassemblies $TB_{1\ to\ n}$ are responsible for system-relevant functions. The primary plug-in subassembly $TB_1$ with the network element controller NEC is responsible for system-relevant functions including monitoring functions and control functions. These latter functions require base data (or configuration data) to be allocated to each device.

This base data can encompass information such as an address of the overall device, variable data, and basic information required by the device in order to recognize its identity. Base data can also contain details for a minimal configuration with settings that may not be generally definable, since such settings may be dependent on where they are used.

Most of the secondary plug-in subassemblies $TB_{2\ to\ n}$ and the primary plug-in subassembly $TB_1$ with the network element controller NEC have a microprocessor unit with a permanent storage. When none of the secondary plug-in subassemblies $TB_{2\ to\ n}$ has a microprocessor unit, at least one of the secondary plug-in subassemblies $TB_{2\ to\ n}$ has a permanent storage that can be read and/or described by the network element controller NEC.

Figure 4:
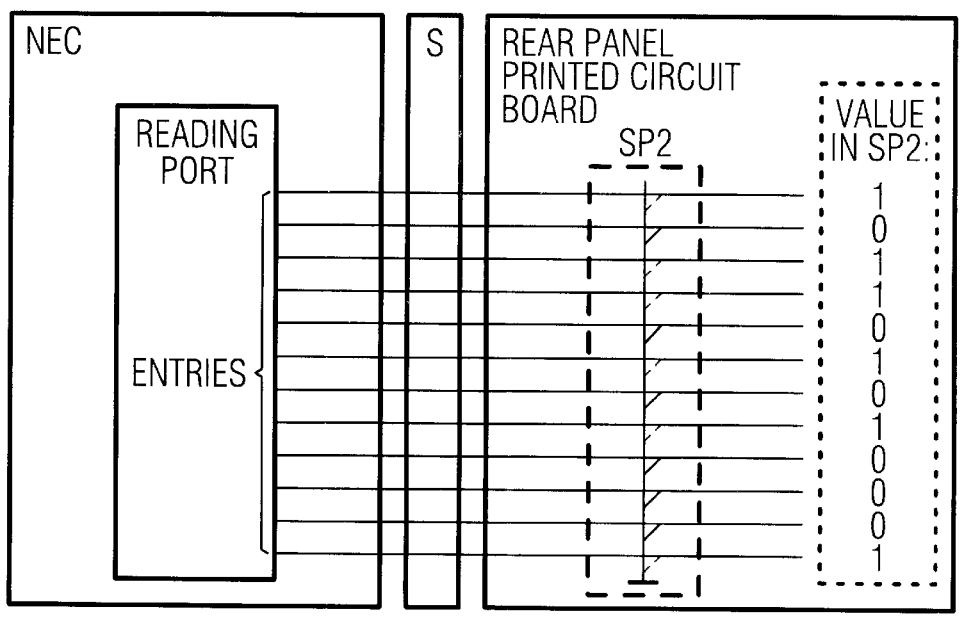
FIG. 4 is a schematic diagram showing a realization of a second storage unit.

The second storage unit $SP_2$, which is arranged on the rear panel printed circuit board RP, as shown in FIG. 4, is comprised of lines, solder bridges or leadthroughs on the rear panel printed circuit board RP. The second storage unit $SP_2$ can also be fashioned from a diode matrix or from similar elements that exhibit a high reliability. An identifier NR with which the configuration data of the device unit DU can be unmistakably recognized and associated with is deposited in the second storage unit $SP_2$. This second storage unit's $SP_2$ identifier NR can later be read by the network element controller NEC during operation.

The processor can compare the first identifier in the first storage unit $SP_1$ on the primary subassembly with the identifier that is permanently stored in the second storage unit $SP_2$. If these identifiers match, one can be assured that the associated configuration data stored in the first storage unit $SP_1$ is the correct data for the device unit. A matching identifier and proper associated configuration data may also be found on any secondary subassemblies as well.

A storage procedure for the configuration data can be described as follows. In FIG. 1, a primary plug-in subassembly $TB_1$ with the network element controller NEC within a device unit DU, may be configured via an operating computer, or may be supplied pre-configured.

The network element controller NEC stores configuration data in its own first storage $SP_1$ with the content of the second storage unit $SP_2$. A base data record BD (see FIG. 2) results from these data that are deposited in the first storage unit $SP_1$. This base data record BD is made of the configuration data and the identifier NR, and is permanently stored on the primary plug-in subassembly $TB_1$ and/or is also transmitted to as many secondary plug-in subassemblies $TB_{2\ to\ n}$ as possible after the production of this base data record BD.

When the voltage supply of a device unit DU is switched off or when the network element controller NEC is plugged in a sub-rack, potentially with a few secondary plug-in subassemblies $TB_{2\ to\ n}$, the following events occur. When the network element controller NEC starts up, it reads the contents of the second storage unit $SP_2$ on the rear panel printed circuit board. The network element controller NEC then compares the identifier NR it has stored in the data record BD with the identifier NR of the second storage unit $SP_2$. If both identifiers indicate a match, the network element controller NEC recognizes that it is situated in the correct sub-rack.

If, however, the characters do not indicate a match, the network element controller NEC interrogates the permanent storages of the secondary plug-in subassemblies $TB_{2\ to\ n}$ of the sub-rack of the network element controller NEC. When the network element controller NEC finds a data record BD whose identifier NR conforms with the identifier NR in the second storage $SP_2$, the network element controller NEC recognizes that a valid data record BD is present and accepts the data record from the permanent storage of the relevant plug-in subassembly $TB_n$. It therefore suffices for the receiving of valid configuration data that a single plug-in subassembly $TB_n$ has not been replaced by a storage element. This method eliminates complex verification methods such as majority-voting. The network element controller NEC can also later update the base data record BD of secondary plug-in subassemblies $TB_{2\ to\ n}$ that do not contain configuration data that match the network element controller NEC.

Where no single plug-in subassembly has the proper identifier NR in the second storage unit $SP_2$, the network element controller NEC can, with certainty, recognize that it does not have the correct data and that it cannot obtain correct data on its own. Depending on the application, the network element controller NEC can signal an operating computer, demand valid data from the operating computer, abort operation, and/or continue to work with universally valid replacement data.

When the configuration data are, in the course of the operation, modified by an operating computer, they will not only be subsequently stored as a data record BD on the primary plug-in subassembly $TB_1$ of the network element controller NEC by the network element controller NEC but they will also be distributed to as many secondary plug-in subassemblies $TB_{2\ to\ n}$ as possible (as described above). As a result, the current version of the base data BD is always available to the network element controller NEC if there is a later exchange of the primary plug-in subassembly $TB_1$ with the network element controller NEC.

FIG. 2 shows the arrangement of the first storage unit $SP_1$ in which the first identifier NR is stored with configuration data, and the second storage unit $SP_2$ in which the second identifier NR is stored. As described above, the configuration data are stored in a storage area of the network element controller NEC. Together with the identifier NR, the configuration data form the base data record BD. In addition, the identifier NR, which may be represented by a sequence of numbers, are deposited in the second storage unit $SP_2$. This second storage unit $SP_2$ is preferably fashioned from passive elements. An embodiment of the second storage unit $SP_2$ is shown in FIG. 4.

Figure 3:
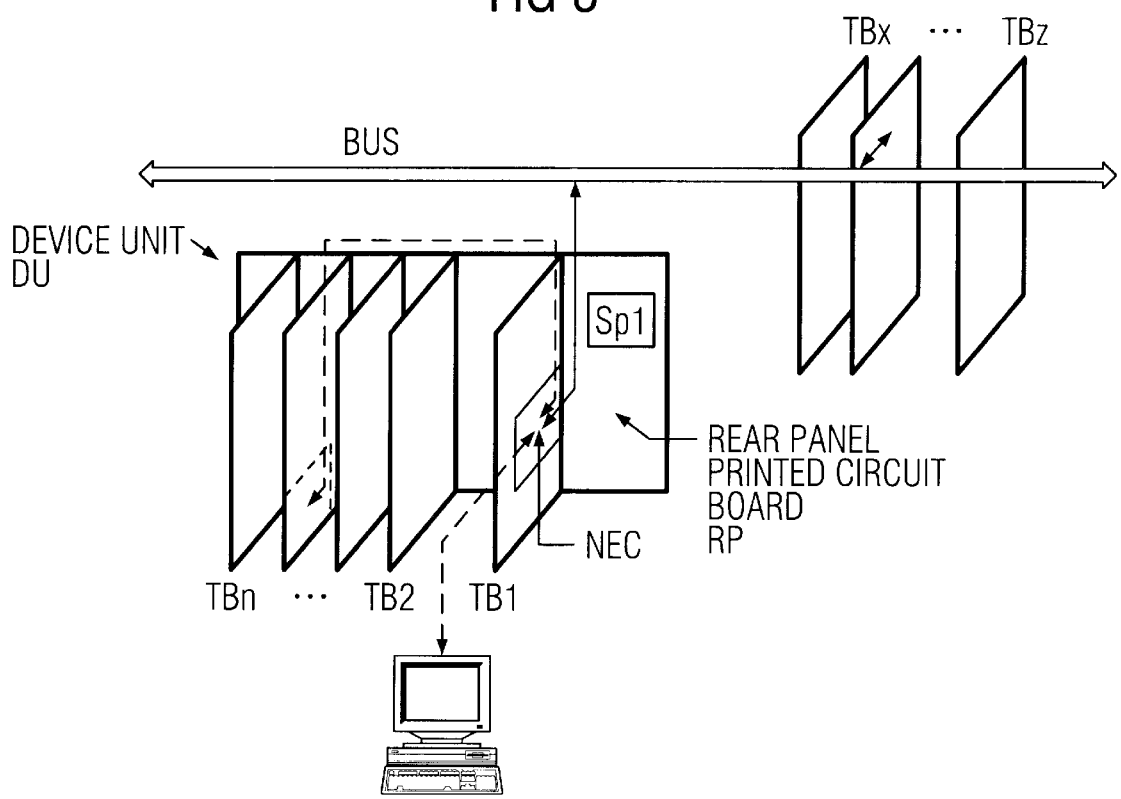
FIG. 3 is a physical diagram showing a device unit with connections to further device units.

FIG. 3 shows a circuit arrangement that illustrates how, given that the correct identifier NR is not present, the network element controller NEC searches for the identifier NR in a permanent storage of the plug-in subassemblies $TB_{2\ to\ n}$ of the device unit DU. FIG. 3 also illustrates how the network element controller NEC searches identical device units DUs in order to receive the configuration data, where the correct identifier NR is not present, via a bus. When a search for the identifier NR in other units is unsuccessful, configuration data might be provided via an operating computer (as described above).

FIG. 4 shows an embodiment of the second storage unit $SP_2$. This embodiment shows a 12 bit storage which can allow 4096 different identifiers NR for base data records. The encoding of the storage unit $SP_2$ can either be done by disconnecting the lines or by throughplatings of the rear panel printed circuit board. When a greater number of devices are to be characterized, a larger number of bits may be used. For example, a 24-bit storage might be utilized to allow 16.7 million devices or plug-in subassemblies to be identified.

One embodiment of the second storage unit $SP_2$ might be a diode matrix, as is used in keyboards, which is the most economical solution. For this alternative embodiment, 3+8 lines are sufficient for reading out data. Here, the encoding could also be implemented by methods such as undoing lines to these diodes, or by numbering the rear panels in production such that a position corresponding to a binary "one" is assembled with a diode, but a position corresponding to a binary "zero" remains unassembled.

FIG. 4 illustrates an exemplary second storage unit $SP_2$ comprised of 12 lines that are to be individually undone. This second storage unit $SP_2$ can be read out via entries of the network element controller NEC provided therefor. The reference potential is a ground wire connected to the network element controller NEC (not shown).

This alternative embodiment is advantageous when the second storage unit $SP_2$ on the rear panel of the rear panel printed circuit board RP lies as close as possible to the plug connector strip S of the plug-in subassembly $TB_1$ due to the short connecting paths. The network element controller NEC is connected to it via 12 lines all together in the most simple 12 bit storage, or alternatively, for example, via 11 lines in a 24 bit storage of a diode matrix. The terminals are guided via a subassembly connector S. For the alternative diode matrix embodiment, eight terminals of the microprocessor bus itself could be utilized. Since all terminals only serve the purpose of reading, they can be buffered via resistors, which helps avoid disturbances.

The binary value $101101010001_2 = 2897_{10}$ is shown as an example, where each of the disconnected slanted lines to the reference potential represents a binary "one" and where the input pin uppermost in the image shows the most significant bit. The solid slanted lines represent the lines that are not split, which respectively represent a binary "zero".

When reading the second storage unit $SP_2$, the lines to the reading-port of the controller are put on the potential, which is opposite to the potential zero, via resistors (not shown), for example, on the network element controller NEC. Where the storage line remains connected, the kept potential is now read as a zero, otherwise, where the line is disconnected, the kept potential is now read as one. The value can, bit by bit, be directly or indirectly read in when the bus size of the controller allows this.

This type of second storage unit $SP_2$ is not described from the aspect of the network element controller NEC, but rather is described from the aspect of purposeful intervention during the manufacturing of the rear panel printed circuit board. An encoding can also be achieved by undoing or melting open the lines in the second storage unit $SP_2$. A through-melting is possible with a simple programming device, for example, which can be connected to the plug connector strip for the network element controller NEC. A simple switch for the input of the number and a battery with approximately 1 volt would be sufficient to accomplish this.

The second storage unit $SP_2$ can also be implemented with conventional dual-in-line-coding-switches, soldering jumpers, and similar methods, if required by the customer. The storage unit $SP_2$ can also be fastened at the rack for the device unit DU and can be inseparably connected in an electrical manner to the rear panel of the device unit DU. This provides the essential characteristic that the second storage unit $SP_2$ always remains in the device for maintenance actions such as device settings via computers, subassembly exchanges, etc.

Although modifications and changes may be suggested by those skilled in the art, it is the intention of the inventor to embody within the patent warranted hereon all changes and modifications as reasonably and properly come within the scope of their contribution to the art.

I claim as my invention:

1. A circuit arrangement for checking data of a device unit, comprising:

a primary subassembly detachably connected to a rear panel printed circuit board of said device unit;

a processor arranged on said primary subassembly;

a first storage unit arranged in said processor, said first storage unit for storing a first identifier associated with configuration data;

a second storage unit inseparably arranged on said rear panel printed circuit board of said device unit, said second storage unit for storing a second identifier with which configuration data of said device unit can be unmistakably recognized and associated; and a comparator arranged in said processor which reads said second identifier, compares said second identifier with said first identifier, and if said first identifier conforms with said second identifier, said processor releases said configuration data stored in said first storage unit to said device unit.

2. A circuit arrangement according to claim 1, further comprising a secondary subassembly which is connected to a rear panel printed circuit board via connections, said secondary subassembly having an additional storage unit, said additional storage unit having an additional identifier, wherein said comparator reads said second identifier, compares said second identifier with said first identifier, and if said first identifier does not conform with said second identifier, said processor reads said additional identifier, compares said second identifier with said additional identifier, and if said additional identifier conforms with said second identifier, said processor releases said configuration data stored in said additional storage unit to said device unit.

3. A circuit arrangement according to claim 1, wherein said second storage unit is fashioned from passive storage elements.

4. A circuit arrangement according to claim 1, wherein said second storage unit comprises a matrix of a plurality of rows and a column, wherein a binary value of "zero" is represented by a connection between a row and a column, and a binary value of "one" is represented otherwise.

5. A circuit arrangement according to claim 1, wherein said second storage unit comprises a matrix of a plurality of rows and columns, wherein a binary value of "zero" is represented by a connection between a row and a column, and a binary value of "one is represented otherwise.

6. A circuit arrangement according to claim 1, wherein said processor further comprises:

read entries which correspond to a row number of said second storage unit.

7. A method for checking data of a device unit, the method comprising the steps of:

detachably connecting a primary subassembly of said device unit to a rear panel printed circuit board of said device unit via plug connectors, said primary subassembly including a processor;

storing a first identifier associated with configuration data in a first storage unit arranged in said processor;

storing a second identifier in a second storage unit inseparably arranged on said rear panel printed circuit board of said device unit, said second identifier being that with which configuration data of said device unit can be unmistakably recognized and associated;

reading said second identifier by said processor;

comparing said second identifier with said first identifier by said processor; and releasing said configuration data from said first storage unit to said device unit if said second identifier conforms with said first identifier.

8. A method according to claim 7, further comprising the steps of:

connecting a secondary subassembly, said second subassembly having an additional storage unit, after said step of comparing said second identifier with said first identifier, if said second identifier does not conform with said first identifier, comparing said second identifier with said additional identifier, and, if said second identifier conforms with said additional identifier, releasing said configuration data from said additional storage unit.

* * * * *